SWITCHABLE CIRCULATOR R.F. AMPLIFICATION FAULT CIRCUIT FOR A MICROWAVE RECEIVER

Filed Aug. 29, 1966

INVENTOR
FRED STERZER
BY
Edward J. Norton
Attorney 3,491,357
Patented Jan. 20, 1970

3,491,357

SWITCHABLE CIRCULATOR R.F. AMPLIFICATION FAULT CIRCUIT FOR A MICROWAVE RECEIVER

Fred Sterzer, Princeton, N.J., assignor to RCA Corporation, a corporation of Delaware Filed Aug. 29, 1966, Ser. No. 575,598
Int. Cl. G01b 9/00
U.S. Cl. 343—5 4 Claims

ABSTRACT OF THE DISCLOSURE

Disclosed is a circuit in which an input signal is coupled to both an R.F. amplifier, which may be a tunnel diode amplifier, and a mixer stage of a microwave receiver through a three port switchable circulator. So long as the amplifier is in an operative condition, the switchable circulator is maintained in a first switch condition wherein the signal goes through the amplifier prior to being applied to the mixer of the receiver. However, should the amplifier fail, the circulator may be switched to a second switch condition wherein the input signal is applied directly to the mixer of the receiver without going through the failed amplifier. A circuit for automatically switching the circulator from its first to its second switch condition in response to failure of the amplifier is also disclosed. Further disclosed is the use of two cascaded switchable circulators, only the first of which has an RF amplifier coupled thereto, in the front end of a radar receiver, which makes it possible to additionally utilize the switchable circulators for transmit-receive purposes in a radar system.

Figure 1:
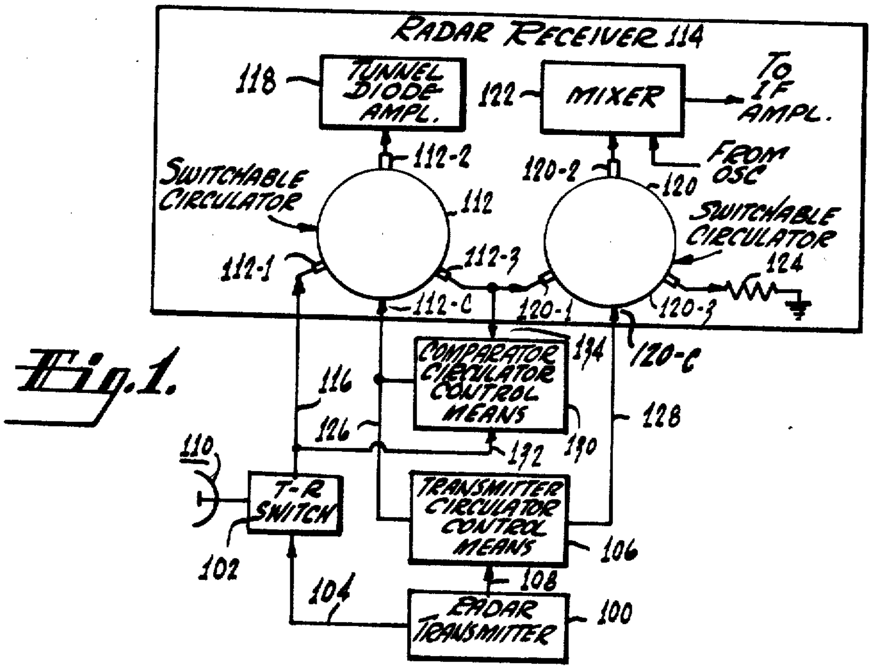

This invention relates to a switchable-circulator R.F. amplification fault circuit for a microwave receiver and, more particularly, to such a circuit for use in a radar receiver.

Often the front end of a microwave receiver utilizes an amplifier, such as a tunnel diode amplifier, to provide R.F. amplification of the input signal prior to its application to the mixer stage of the receiver. At times an element of the amplifier, such as the tunnel diode, fails. This causes the amplifier to become inoperative. As a matter of fact, a tunnel diode amplifier, in response to the failure of the tunnel diode therein, results in attenuation rather than amplification, of the applied input signal. Since this is true, it would be highly desirable effectively to remove the amplifier entirely from the circuit in response to the failure thereof and apply the input signal directly to the mixer stage instead. In this case, although no R.F. amplification of the signal is obtained prior to its application to the mixer stage, at least it is not attenuated by an element, such as a tunnel diode, which has failed.

It is therefore an object of the present invention to prevent attenuation of an input signal to a microwave receiver due to a defective R.F. amplifier.

In accordance with the present invention an input signal of a microwave receiver is coupled to the first port of a three port switchable circulator. The second port of the switchable circulator is coupled to a reflection type R.F. amplifier, which may be a reflection type tunnel diode amplifier, for example. The third port of the three port switchable circulator, in turn, is coupled to the mixing stage of the microwave receiver. The switchable circulator, when in a first switch condition thereof, is effective in that given direction which goes in order from the first port thereof to the second port thereof to the third port thereof. The switchable circulator, when in a second switch condition thereof, is effective in the opposite direction to the given direction which goes in order from the first port thereof to the third port thereof to the second port thereof. Therefore, by normally maintaining the switchable circulator in its first switch condition an input signal applied to the first port of the switchable circulator is amplified by the R.F. amplifier coupled to the second port thereof and this amplified signal is then transferred to the third port thereof and on to the mixing stage. However, should the R.F. amplifier fail, the switchable circulator may be switched to its second switch condition, in which case the input signal applied to the first port thereof is transferred directly to the third port thereof and on to the mixing stage, thereby effectively removing the defective R.F. amplifier from the circuit.

In a preferred embodiment of the present invention the microwave receiver is a radar receiver. In this case, the means for applying the signal from the third port of the aforementioned switchable circulator includes a second three port switchable circulator. The use of two switchable circulators permits both the R.F. amplifier and the mixing stage to be decoupled momentarily during the transmission of each radar exploratory pulse, so that the radar receiver is not overloaded thereby.

Figure 2:
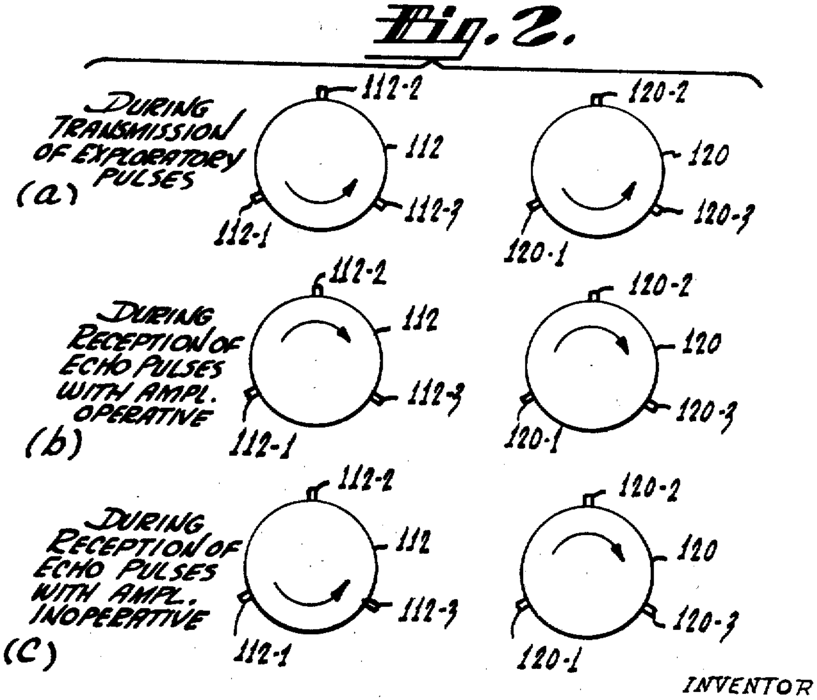

These and other objects, features and advantages of the present invention will become more apparent from the following detailed description taken together with the accompanying drawing in which:

FIG. 1 is a block schematic diagram of a preferred embodiment of the present invention; and FIG. 2 illustrates the various alternative switch conditions of the switchable circulators shown in FIG. 1.

Referring now to FIG. 1, there is shown radar transmitter 100 which periodically, in response to a keying pulse, applies a pulse of R.F. energy to T–R switch 102 over connection 194. Simultaneously therewith the keying pulse itself is applied from radar transmitter 100 as an input to transmitter circulator control means 106 over connection 108. In a manner well known in the art, T–R switch 102 forwards nearly all of the energy in the R.F. pulse applied thereto to radar antenna 110. Radar antenna 110, in response thereto, radiates an exploratory pulse.

Since T–R switch 102 is not ideal, some of the energy from transmitter 100 applied thereto over connection 104 leaks therethrough to port 112–1 of switchable circulator 112 of radar receiver 114 over connection 116.

Any echo pulses received in response to each transmitted exploratory pulse is received by antenna 110 and applied to T–R switch 102. T–R switch 102, in a manner well known in the art, forwards substantially all the received energy applied thereto from 110 to port 112–1 of switchable circulator 112 over connection 116. The signals applied to port 112–1 of switchable circulator 112 constitute the input to radar receiver 114.

Port 112–2 of switchable circulator 112 is coupled to reflection type tunnel diode amplifier 118. Port 112–3 of switchable circulator is coupled to port 120–1 of switchable circulator 120. Port 120–2 of switchable circulator 120 is coupled as a first input to mixer 122. A second input to mixer 122 is applied from the local oscillator (not shown) in radar receiver 114. The output of mixer 122 is applied as an input to the I.F. amplifier (not shown) of radar receiver 114. Port 120–3 of switchable circulator 120 is coupled to a point of reference potential through dissipating load resistance 124.

Switchable circulators such as switchable circulators 112 and 120, are well known in the art of circulators. For the purposes of this invention, all that is pertinent is that the switch condition of a switchable circulator may be controlled in accordance with the polarity or direction of current applied to a control input of the switchable circulator. More particularly, switchable circulator 112 in response to a current of a given one direction applied to control input 112–C thereof is switched to its first switch condition wherein energy is transferred in that predetermined direction which goes in order from port 112–1 thereof to port 112–2 thereof to port 112–3 thereof. In a similar manner, switchable circulator 120, in response to a control current of the aforesaid given one direction applied to control input 120–C thereof, is switched to a first switch condition wherein energy is transferred in that predetermined direction which goes in order from port 120–1 thereof to port 120–2 thereof to port 120–3 thereof.

When the direction of the control current applied to control input 112–C of switchable circulator 112 is in a direction opposite to the aforesaid given one direction, switchable circulator 112 is switched to its second switch condition wherein energy is transferred in a direction which goes in order from port 112–1 thereof to 112–3 thereof to 112–2 thereof. In a similar manner, when control current applied to input 120–C of switchable circulator 120 is opposite to the aforesaid given direction, switchable circulator 120 is switched to its second switch condition wherein energy is transferred in a direction which goes in order from port 120–1 to port 120–3 thereof to port 120–2 thereof.

Transmitter circulator control means 106 is normally effective in applying a current to control input 112–C of switchable circulator 112 over connection 126 and for supplying a control current to control input 120–C of switchable circulator 120 over connection 128 which are, respectively, in the aforesaid given one direction. Therefore, both switchable circulator 112 and switchable circulator 120 are normally in their first switch condition. This is the condition which normally prevails during the reception of echo pulses with tunnel diode amplifier 118 in its operative condition, as shown by the direction of the arrows of switchable circulators 112 and 120 in FIG. 2(*b*). However, in response to the application of the keying pulse to transmitter circulator control means 106 from radar transmitter 100 over connection 108 during transmission of each exploratory pulse, transmitter control means 106 is effective in reversing the direction of the control currents applied to control inputs 112–C and 120–C, respectively. Therefore, during the transmission of exploratory pulses both switchable circulator 112 and switchable circulator 120 are in their second switch condition, as shown by the direction of the arrows in FIG. 2(*a*).

From the foregoing, it will be seen that during the transmission of each exploratory pulse any input signal applied to port 112–1 will be transferred through switchable circulator 112 to port 112–3, without any amplification taking place, and then directly from port 120–1 to port 120–3 of switchable circulator 120, where any energy reaching port 120–3 is dissipated in load resistance 124. In this manner, tunnel diode amplifier 118 and mixer 122 are isolated from energy in each exploratory pulse which directly reaches receiver 114, so that there is no overloading of radar receiver 114 during transmission.

Comparator circulator control means 130 has a first input 132 thereof coupled to port 112–1 of switchable circulator 112 and a second input 134 thereof coupled to port 112–3 of switchable circulator 112. Comparator circulator control means 130 serves to compare the amplitude of the input signal to switchable circulator 112, applied as the first input thereto at input 132, with the output signal from switchable circulator 112, applied as the second input thereto at input 134. Comparator circulator control means 130 initially applies a control current to control input 112–C of switchable circulator 112 in the aforesaid given one direction, whereby switchable circulator 112 is normally in its first switch condition, except during the transmission of each exploratory pulse, as described above. So long as the amplitude of the output signal from switchable circulator 112, at port 112–3 thereof, remains greater than the amplitude of the input signal to switchable 112, at port 112–1 thereof, which is an indication that tunnel diode amplifier 118 is operative, comparator circulator control means 130 maintains switchable circulator 112 in its first switch condition. Therefore, with amplifier 118 operative the situation shown in FIG. 2(*b*) prevails during the reception of echo pulses.

If the tunnel diode in tunnel diode amplifier 118 fails, however, tunnel diode amplifier 118 will become inoperative. Should tunnel diode amplifier 118 become inoperative, the signal applied thereto will be attenuated, rather than amplified, thereby. Therefore, the amplitude of the output signal arriving at port 112–3 of circulator 112 will be smaller than the amplitude of the input signal applied to port 112–1 thereof. Under these conditions, comparator circulator control means 130 will apply a control current to control input 112–C of switchable circulator 112 having a direction opposite to the aforesaid given one direction. This will result in switchable circulator 112 being switched to its second switch condition, whereby tunnel diode amplifier 118 is effectively removed from the circuit. The direction of the arrows of circulators 112 and 120 in FIG. 2(*c*) show the respective switch conditions of these circulators during reception of echo pulses with amplifier 118 inoperative.

There are many alternate means for sensing when amplifier 118 has failed. For example, the dc bias current to the amplifier changes if the tunnel diode fails, and this change in dc current can be sensed by means well known to the art. Once the sensing apparatus senses that the amplifier has failed, it actuates a control current to switch circulator 112 to the position indicated in FIG. 2(*c*).

Although in the preferred embodiment shown in FIG. 1 comparator circulator control means 130 operates automatically to switch circulator 112 from its first to its second switch condition in response to tunnel diode amplifier 118 becoming inoperative, the present invention also contemplates the use of a manual switch to switch the direction of the control current in switchable circulator 112 to thereby effectively remove tunnel diode amplifier 118 when it becomes inoperative. In addition, circulator 112 may be switched either automatically or manually to its second condition, even when amplifier 118 is operative, should the absolute amplitude of the output signal from circulator 112 with amplification exceed a predetermined maximum value. Further, although the preferred embodiment of the present invention relates to a radar system, it is apparent that the present invention has utility in any microwave receiver in which the R.F. input signal is amplified prior to being applied to the mixer stage thereof. Therefore, although only a preferred embodiment of the present invention has been described in detail herein, it is not intended that the invention be restricted thereto, but that it be limited only by the true spirit and scope of the appended claims.

What is claimed is:

1. A microwave receiver including a front end comprising a switchable circulator having first, second and third ports, said circulator when in a first switch condition thereof being effective in solely that one direction which goes in order from said first port to said second port to said third port and when in a second switch condition thereof being effective in solely the opposite direction which goes in order from said first port to said third port to said second port, means for applying an input signal to said receiver to said first port, an amplifier coupled to said second port effective in amplifying said input signal solely when both said circulator is in its first switched condition and said amplifier is operative, means including a mixer coupled to said third port which is responsive to said amplified signal when said circulator is in its first switch condition and is responsive to said input signal itself when said circulator is switched to its second switch condition, and means for switching said circulator from its first switch condition to its second switch condition, said last-named means comprising means for automatically switching said circulator from its first to its second switch condition in response to the failure of said amplifier to be operative.

2. The microwave receiver defined in claim 4, wherein said means responsive to the failure of said amplifier to be operative includes a comparator circulator control means coupled between said first port and said third port of said circulator for switching said circulator from its first switch condition to its second switch condition in response to the signal level at said third port being below the signal level at said first port.

3. In a radar system, a microwave receiver including a front end comprising first and second switchable circulators each having first, second and third ports, each of said circulators when in a first switch condition thereof being effective in solely that one direction which goes in order from said first port to said second port to said third port and when in a second switch condition thereof being effective in solely the opposite direction which goes in order from said first port to said third port to said second port, means for applying any echo pulses received in response to the transmission of an exploratory pulse as an input signal to said first port of said first circulator, an amplifier coupled to said second port of said first circulator, means for coupling said first port of said second circulator to said third port to said first circulator, a mixer coupled to said second port of said second circulator, signal dissipating means coupled as a load to said third port of said second circulator, and means responsive to the failure of said amplifier to be operative for switching said first circulator from its first switch condition to its second switch condition, whereby each of said first and second circulators may be maintained in said second switch condition thereof during the transmission of said exploratory pulse, each of said first and second circulators when said amplifier is operative may be maintained in said first switch condition thereof during the receipt of said echo pulses, and when said amplifier fails to be operative during the receipt of said echo pulses said first circulator may be maintained in said second switch condition thereof and said second circulator may be maintained in said first switch condition thereof.

4. The microwave receiver defined in claim 1, wherein said means responsive to the failure of said amplifier to be operative includes a comparator circulator control means coupled between said first port and said third port of said first circulator for switching said first circulator from its first switch condition to its second switch condition in response to the signal level at said third port being below the signal level at said first port.

References Cited

UNITED STATES PATENTS

| | | | |
|---|---|---|---|
| 3,082,383 | 3/1963 | Stern | 333—1.1 |
| 3,095,561 | 6/1963 | Hubka | 343—5 |
| 3,244,999 | 4/1966 | Hoover | 330—34 X |
| 3,248,662 | 4/1966 | Brownell et al. | 330—61 |
| 3,309,698 | 3/1967 | Baldock | 343—5 |
| 3,168,707 | 2/1965 | Levitt et al. | 330—51 X |

RODNEY D. BENNETT, Jr., Primary Examiner
HERBERT C. WAMSLEY, Assistant Examiner

U.S. Cl. X.R.

333—3; 330—51; 325—362

PO-1050
(5/69)

UNITED STATES PATENT OFFICE
CERTIFICATE OF CORRECTION

Patent No. 3,491,357 Dated June 23, 1970

Inventor(s) Fred Sterzer

It is certified that error appears in the above-identified patent and that said Letters Patent are hereby corrected as shown below:

Col. 5, line 5, change "4" to read -- 1 --.

Col. 6, line 10, change "1" to read -- 3 --.

SIGNED AND
SEALED
OCT 20 1970

(SEAL)
Attest:

Edward M. Fletcher, Jr.
Attesting Officer

WILLIAM E. SCHUYLER, JR.
Commissioner of Patents